United States Patent
Valdes

(10) Patent No.: US 10,935,609 B2
(45) Date of Patent: Mar. 2, 2021

(54) METHODS AND SYSTEMS FOR GROUND FAULT DETECTION IN A POWER DISTRIBUTION SYSTEM

(71) Applicant: ABB Schweiz AG, Baden (CH)

(72) Inventor: Marcelo Esteban Valdes, Chapel Hill, NC (US)

(73) Assignee: ABB Schweiz AG, Baden (CH)

( * ) Notice: Subject to any disclaimer, the term of this patent is extended or adjusted under 35 U.S.C. 154(b) by 505 days.

(21) Appl. No.: 15/702,080

(22) Filed: Sep. 12, 2017

(65) Prior Publication Data
US 2019/0079129 A1    Mar. 14, 2019

(51) Int. Cl.
*G01R 31/50* (2020.01)
*H02H 3/16* (2006.01)

(52) U.S. Cl.
CPC .............. *G01R 31/50* (2020.01); *H02H 3/16* (2013.01)

(58) Field of Classification Search
CPC .......... H02H 3/165; H02H 7/263; H02H 7/28; H02H 3/16; G01R 31/52; G01R 31/50
USPC .......... 324/537, 500, 509, 750.01, 521, 600, 324/617, 622, 683, 709, 66
See application file for complete search history.

(56) References Cited

U.S. PATENT DOCUMENTS

| | | |
|---|---|---|
| 2010/0008000 A1 | 1/2010 | Riley et al. |
| 2012/0086459 A1* | 4/2012 | Kim ........................ G01R 29/18 324/522 |
| 2016/0149393 A1* | 5/2016 | Valdes ................... H02H 3/305 361/93.1 |

FOREIGN PATENT DOCUMENTS

| | | |
|---|---|---|
| CA | 1063219 A | 9/1979 |
| CN | 1639938 A | 7/2005 |
| CN | 1664597 A | 9/2005 |
| CN | 1786726 A | 6/2006 |
| CN | 201956698 U | 8/2011 |
| CN | 103683225 A | 3/2014 |
| CN | 105305632 A | 2/2016 |

(Continued)

OTHER PUBLICATIONS

Valdes, Marcelo et al., "Ground Fault Detection in Multiple Source Solidly Grounded Systems Via the Single-processor Concept for Circuit Protection" IEEE, 2005.

(Continued)

*Primary Examiner* — Melissa J Koval
*Assistant Examiner* — Trung Nguyen
(74) *Attorney, Agent, or Firm* — Barnes & Thornburg LLP

(57) ABSTRACT

An example method of operating a solidly grounded, multi-source, multi-phase power distribution system having coupled neutral conductors is disclosed. The power distribution system includes a bus, a plurality of source protection devices coupled to the bus, and a plurality of feeder protection devices coupled to the bus. The method includes receiving, for each source protection device of the plurality of source protection devices, data indicative of detected source phase currents associated with the source protection device. Data indicative of detected feeder neutral currents and detected feeder phase currents associated with the feeder protection device are received for each feeder protection device of the plurality of feeder protection devices. A net source ground fault current associated with the plurality of source protection devices is determined based on the received data indicative of source phase currents and the received data indicative of feeder neutral currents and feeder phase currents.

18 Claims, 7 Drawing Sheets

(56) References Cited

FOREIGN PATENT DOCUMENTS

| CN | 105974267 A | 9/2016 |
|----|-------------|--------|
| EP | 2490311 A1  | 8/2012 |

OTHER PUBLICATIONS

"Ground Fault Protection," Schneider Electric, 2009.

* cited by examiner

METHODS AND SYSTEMS FOR GROUND FAULT DETECTION IN A POWER DISTRIBUTION SYSTEM

BACKGROUND

The present application relates generally to power distribution systems and, more particularly, to methods and systems for ground fault detection in power distribution systems.

Modern power distribution systems often contain multiple power sources integrated within one system. Correct determination of a ground fault in a system with multiple sources in parallel, or with interconnected neutrals is complex. At least some known systems determine ground faults with the addition of external sensors and circuitry to discriminate load and fault currents from circulating currents that are not direct indicators of the fault or load conditions, but nevertheless flow in the same conductors.

BRIEF DESCRIPTION

One aspect is a method of operating a solidly grounded, multi-source, multi-phase power distribution system having coupled neutral conductors. The power distribution system includes a bus, a plurality of source protection devices coupled to the bus, and a plurality of feeder protection devices coupled to the bus. The method includes receiving, for each source protection device of the plurality of source protection devices, data indicative of detected source phase currents associated with the source protection device. Data indicative of detected feeder neutral currents and detected feeder phase currents associated with the feeder protection device are received for each feeder protection device of the plurality of feeder protection devices. A net source ground fault current associated with the plurality of source protection devices is determined based on the received data indicative of source phase currents and the received data indicative of feeder neutral currents and feeder phase currents.

Another aspect is a solidly grounded, multi-phase power distribution system having coupled neutral conductors. The system includes a bus, a plurality of sources, a source protection device coupled between at least one source and the bus, a plurality of feeder protection devices coupled to the bus, and a controller including a processor and a memory. The source protection device includes a plurality of sensors configured to detect a plurality of source phase currents associated with the source protection device. Each feeder protection device includes a plurality of sensors configured to detect a plurality of feeder phase currents and a feeder neutral current associated with the feeder protection device. The memory stories non-transitory instructions that configure the processor to receive data indicative of the detected plurality of source phase currents from the source protection device; receive, from each feeder protection device, data indicative of the detected plurality of feeder phase currents and the detected feeder neutral current; and determine, a net source ground fault current associated with the source protection device based on the received data indicative of source phase currents, the received data indicative of feeder phase currents, and the received data indicative of feeder neutral currents.

Yet another aspect is a solidly grounded, multi-phase power distribution system having coupled neutral conductors. The power distribution system includes a bus, a plurality of sources, a source protection device coupled between at least one source of the plurality of sources and the bus, a plurality of feeder protection devices coupled to the bus, and a controller including a processor and a memory. The source protection device includes a plurality of sensors configured to detect a plurality of source phase currents associated with the source protection device. Each feeder protection device includes a processor, a memory, and a plurality of sensors configured to detect a plurality of feeder phase currents and a feeder neutral current associated with the feeder protection device. Each feeder protection device's memory stores non-transitory instructions that configure the processor to vector sum the plurality of feeder phase currents and feeder neutral currents detected by the plurality of sensors to determine a ground fault current through the feeder protection device, and output a blocking signal if the determined ground fault current exceeds a threshold value. The controllers memory stores non-transitory instructions that configure the processor to receive the detected plurality of source phase currents from the source protection device, receive the detected feeder neutral current from each feeder protection device, determine whether any feeder protection device is outputting a blocking signal, and determine whether to engage a ground fault protection logic of the source protection device based on the received source phase currents, the received feeder neutral currents, and the determination of whether any feeder protection device is outputting a blocking signal.

DETAILED DESCRIPTION

Figure 1:
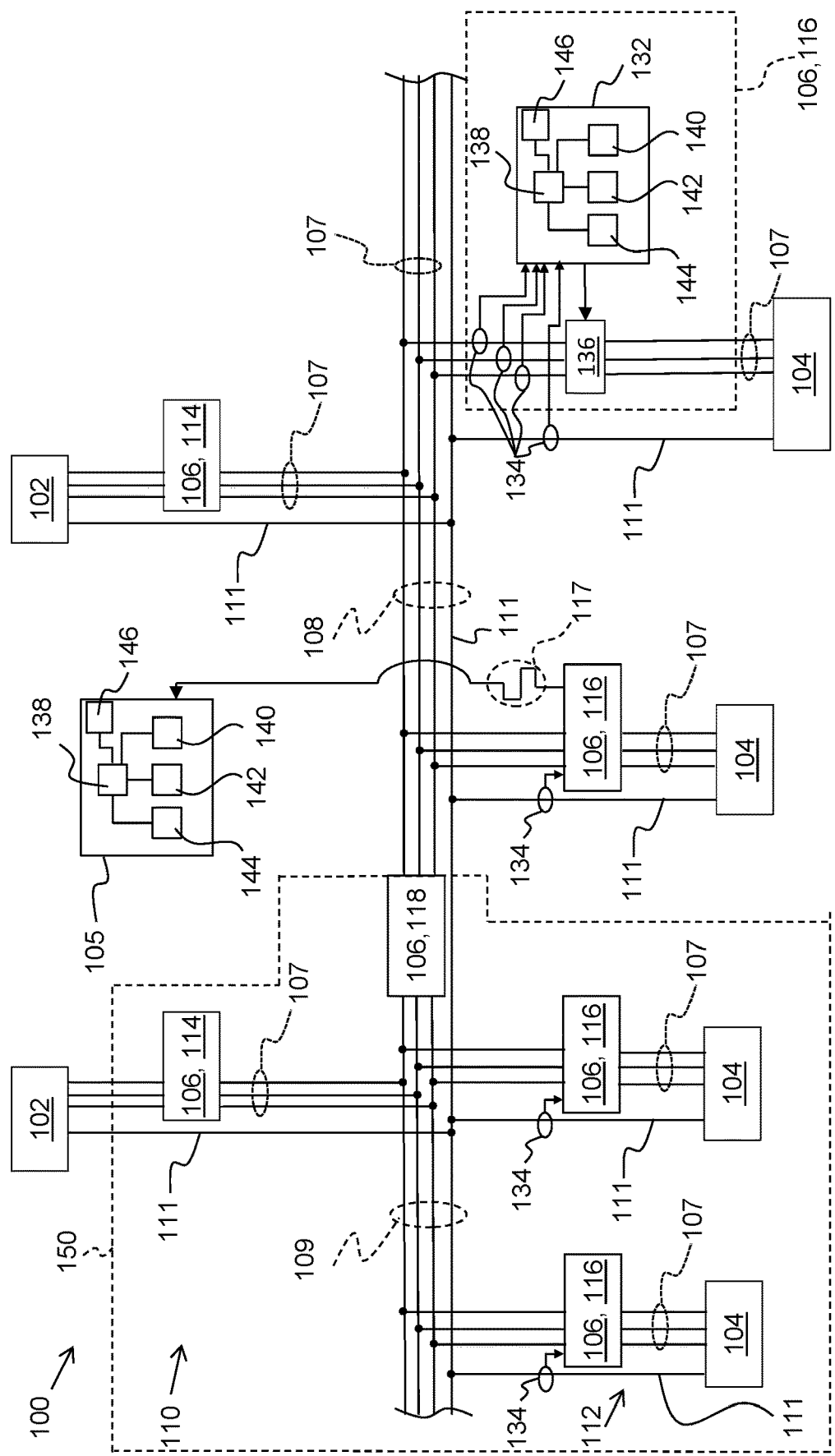
FIG. 1 is a schematic block diagram of an exemplary multi-phase power distribution system.

In the following specification and the claims, reference will be made to a number of terms, which shall be defined to have the following meanings.

The singular forms "a", "an", and "the" include plural references unless the context clearly dictates otherwise.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately", and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

As used herein, the terms "processor" and "computer" and related terms, e.g., "processing device", "computing device", and "controller" are not limited to just those integrated circuits referred to in the art as a computer, but broadly refers to a microcontroller, a microcomputer, a programmable logic controller (PLC), an application specific integrated circuit (ASIC), and other programmable circuits, and these terms are used interchangeably herein. In the embodiments described herein, memory may include, but is not limited to, a computer-readable medium, such as a random-access memory (RAM), and a computer-readable non-volatile medium, such as flash memory. Alternatively, a compact disc-read only memory (CD-ROM), a magneto-optical disk (MOD), and/or a digital versatile disc (DVD) may also be used. Also, in the embodiments described herein, additional input channels may be, but are not limited to, computer peripherals associated with an operator interface such as a mouse and a keyboard. Alternatively, other computer peripherals may also be used that may include, for example, but not be limited to, a scanner. Furthermore, in the exemplary embodiment, additional output channels may include, but not be limited to, an operator interface monitor.

Further, as used herein, the terms "software" and "firmware" are interchangeable, and include any computer program stored in memory for execution by personal computers, workstations, clients and servers.

As used herein, the term "non-transitory computer-readable media" is intended to be representative of any tangible computer-based device implemented in any method or technology for short-term and long-term storage of information, such as, computer-readable instructions, data structures, program modules and sub-modules, or other data in any device. Therefore, the methods described herein may be encoded as executable instructions embodied in a tangible, non-transitory, computer readable medium, including, without limitation, a storage device and/or a memory device. Such instructions, when executed by a processor, cause the processor to perform at least a portion of the methods described herein. Moreover, as used herein, the term "non-transitory computer-readable media" includes all tangible, computer-readable media, including, without limitation, non-transitory computer storage devices, including, without limitation, volatile and nonvolatile media, and removable and non-removable media such as a firmware, physical and virtual storage, CD-ROMs, DVDs, and any other digital source such as a network or the Internet, as well as yet to be developed digital means, with the sole exception being a transitory, propagating signal.

Exemplary embodiments of power distribution systems and methods of operating power distribution systems to detect ground faults are described herein. The exemplary power distribution systems are configured to detect ground faults without needing to measure the neutral current associated with source protection devices.

FIG. 1 is a schematic block diagram of a portion of an exemplary multi-phase electrical power distribution system 100 including sources 102 providing power to loads 104 via circuit protection devices 106. System 100 includes a central controller 105 communicatively coupled to circuit protection devices 106. Other embodiments do not include a central controller 105. In some embodiments, one of circuit protection devices 106 operates as central controller 105.

In the example embodiment, system 100 is a double-ended substation and sources 102 are solidly grounded, wye-connected transformers. A solidly grounded system is one in which the system is connected to the Earth (such as by a wire attached to a metal pole driven into the ground) without any additional resistance deliberately added to the connection to ground. In other embodiments, system 100 is a ring bus configuration with N sources and N busses. In other embodiments, electrical power sources 102 may include, for example, generators, electrical grids, or other devices that provide electrical current (and resulting electrical power) to loads 104. The electrical current is transmitted to loads 104 through a first distribution bus 108 and a second distribution bus 109. Typically, first and second distribution busses 108 and 109 are connected together to act as a single bus connecting sources 102 in parallel. First and second distribution busses 108 and 109 may be selectively separated (by opening a tie protection device 118 between them) into separate busses each connected to its own source 102, but maintaining connected neutral conductors. Loads 104 may include, but are not limited to only including, machinery, motors, lighting, other power distribution systems, and/or other electrical and mechanical equipment of a manufacturing or power generation or distribution facility. Although two sources 102 are shown in FIG. 1, system 100 may include any suitable number of sources 102 connected to any suitable number of busses.

System 100 is a three-phase system using separate phase conductors 107 for each phase of current and separate neutral conductors 111. Phase conductors 107 pass through circuit protection devices 106, and may be interrupted by tripping the circuit protection device 106 through which they pass. Neutral conductors 111 are coupled together and do not pass through circuit protection devices 106. Thus, when a circuit protection device 106 is in an open (non-conducting) state, current on phase conductors 107 passing through it is interrupted, but the associated neutral conductor 111 remains conductively coupled to the other neutral conductors 111. In other embodiments, circuit protection devices 106 are 4-pole circuit breakers through which phase conductors 107 and neutral conductors 111 pass. In such embodiments, neutral conductor 111 passing through a particular circuit protection device 106 does not remain conductively coupled to other neutral conductors when the particular circuit protection device 106 is open. In other embodiments, system 100 may be any other suitable multi-phase system.

In the illustrated embodiment, circuit protection devices 106 are arranged in an electrical hierarchy including a first tier 110 and a second tier 112 to provide different levels of protection and monitoring to power distribution system 100. Second tier 112 is electrically downstream from first tier 110. Generally, each tier 110 or 112 includes circuit protection devices 106 that are the same distance electrically from a source 102. Circuit protection devices 106 in first tier 110 are referred to as source protection devices 114 and are coupled between one of sources 102 and one of first and second busses 108 and 109. Source protection devices 114 receive power from sources 102 and provide power to busses 108 and 109 and provide protection for busses 108 and 109 and devices downstream from busses 108 and 109. Circuit protection devices 106 located in second tier 112 are sometimes referred to as feeder protection devices 116 and are coupled between one of loads 104 and one of first and second busses 108 and 109. Generally, a "feeder" is the portion of a distribution system that receives power directly from bus 108 or 109. Feeder protection devices 116 receive power from busses 108 and 109, provide power to loads 104, and provide protection for devices connected to downstream loads 104. As used herein, the term "downstream" refers to a direction from electrical power source 102 towards load 104. The term "upstream" refers to a direction opposite the downstream direction, for example, from load 104 towards electrical power source 102. While FIG. 1 illustrates circuit protection devices 106 arranged in two tiers 110 and 112, it should be recognized that any suitable number of circuit protection devices 106 may be arranged in any suitable number of tiers to enable power distribution system 100 to function as described herein. For example, it should be recognized that one or more additional tiers and/or circuit protection devices 106 may be disposed between electrical power source 102 and first tier 110 in some embodiments. Additionally or alternatively, one or more additional tiers and/or circuit protection devices 106 may be disposed between load 104 and second tier 112 circuit protection devices 106 in some embodiments. The example methods and operations described herein may be applied to such systems with more than two tiers in the same manner as described herein for a two tier system. In particular, the methods and operations described herein need only be applied to the portions of the system connected immediately upstream or downstream from the distribution bus (such as busses 108 and 109) having multiple sources with connected neutrals.

In the example system 100, distribution busses 108 and 109 are coupled together by a circuit protection devices 106 referred to as a tie or a tie protection device 118. Tie protection device 118 allows power to flow between first and second busses 108 and 109 and provides protection to downstream devices and busses 108 and 109. When closed (i.e., conducting) tie protection device 118 may be considered a source protection device for busses 108 and 109.

Circuit protection devices 106 are circuit breakers. Alternatively, circuit protection devices 106 may be any other device that enables power distribution system 100 to function as described herein. In an exemplary embodiment, each circuit protection device 106 includes an integrated trip unit. Details of an example integrated trip unit are shown for one circuit protection device 106, and are omitted from other circuit protection devices 106 for clarity. Each circuit protection device 106 includes a trip unit 132 operatively coupled to current sensors 134 and a trip mechanism 136. Trip unit 132, in an exemplary embodiment, is an electronic trip unit (ETU) that includes a processor 138 coupled to a memory 140, an input device 142, a display device 144, and a network interface. In some embodiments, trip unit 132 does not include input device 142 and/or display device 144. Trip unit 132 may include, or may be considered to be, a computing device. In other embodiments, trip units 132 may be any other suitable type of trip unit. In some embodiments, one or more of circuit protection devices 106 include a different type of trip unit 132 and/or is a different type of circuit protection device than at least one other of circuit protection devices 106.

Sensors 134 are current sensors, such as a current transformer, a Rogowski coil, a Hall-effect sensor, a fiber optic current sensor, and/or a shunt that measures a current flowing through the phase conductors 107 and neutral conductor 111 to which they are coupled. Alternatively, sensor 134 may include any other sensor that enables power distribution system 100 to function as described herein. Moreover, sensor 134 may be integrated in a circuit protection device 106 or may be separate from an associated circuit protection device 106. Different sensors 134 may be used for different portions of system 100. For example, sensors 134 in first tier 110 may be different than sensors 134 in second tier 112. Each sensor 134 generates a signal representative of the measured or detected current (hereinafter referred to as "current signal") flowing through an associated conductor 107 or 111. In addition, each sensor 134 transmits the current signal to processor 138 associated with, or coupled to, trip mechanism 136. Each processor 138 is programmed to activate trip mechanism 136 to interrupt a current provided to a load 104 or an electrical distribution line or bus 108 or 109 if the current signal, and/or the current represented by the current signal, exceeds a current threshold. Moreover, in some embodiments, processor 138 converts the current signal to the amount (i.e., the magnitude) of electrical current represented by the current signal. Thus, circuit protection devices 106 can send communication signals to other devices, such as other circuit protection devices 106, a remote computing device, a central controller, or the like, that include the amount of current detected rather than a value of the current signal.

In the example embodiment, trip mechanism 136 is a circuit breaker. An electric signal is provided to trip mechanism 136 to cause the circuit breaker to trip and interrupt the flow of current through trip mechanism 136. In other embodiments, trip mechanism 136 includes, for example, one or more other circuit breaker devices and/or arc containment devices. Exemplary circuit breaker devices include, for example, circuit switches, contact arms, and/or circuit interrupters that interrupt current flowing through the circuit breaker device to a load 104 coupled to the circuit breaker device. An exemplary arc containment device includes, for example, a containment assembly, a plurality of electrodes, a plasma gun, and a trigger circuit that causes the plasma gun to emit ablative plasma into a gap between the electrodes in order to divert energy into the containment assembly from an arc or other electrical fault that is detected on the circuit.

Each processor 138 controls the operation of a circuit protection device 106 and gathers measured operating condition data, such as data representative of a current measurement (also referred to herein as "current data"), from sensors 134 associated with trip mechanism 136 coupled to processor 138. Processor 138 stores the current data in a memory 140 coupled to processor 138. It should be understood that the term "processor" refers generally to any programmable system including systems and microcontrollers, reduced instruction set circuits (RISC), application specific integrated circuits (ASIC), programmable logic circuits, and any other circuit or processor capable of executing the functions described herein. The above examples are exemplary only, and thus are not intended to limit in any way the definition and/or meaning of the term "processor." In the example embodiments described herein, processor 138 also controls network communication by its circuit protection device. In other embodiments, processor 138 handles protection operations and a separate processor (not shown) handles network communication.

Memory 140 stores program code and instructions, executable by processor 138, to control circuit protection device 106. Memory 140 may include, but is not limited to only include, non-volatile RAM (NVRAM), magnetic RAM (MRAM), ferroelectric RAM (FeRAM), read only memory (ROM), flash memory and/or Electrically Erasable Programmable Read Only Memory (EEPROM). Any other suitable magnetic, optical and/or semiconductor memory, by itself or in combination with other forms of memory, may be included in memory 140. Memory 140 may also be, or include, a detachable or removable memory, including, but not limited to, a suitable cartridge, disk, CD ROM, DVD or USB memory.

Input device 142 receives input from, for example, a user. Input device 142 may include, for example, a keyboard, a card reader (e.g., a smartcard reader), a pointing device, a mouse, a stylus, a touch sensitive panel (e.g., a touch pad or a touch screen), a gyroscope, an accelerometer, a position detector, a keypad, a communications port, one or more buttons, and/or an audio input interface. A single component, such as a touch screen, may function as both display device 144 and input device 142. Although a single input device 142 is shown, a trip unit 132 may include more than one input device 142 or no input device 142.

Display device 144 visually presents information about circuit protection device 106 and/or trip mechanism 136. Display devices 144 may include a vacuum fluorescent display (VFD), one or more light-emitting diodes (LEDs), liquid crystal displays (LCDs), cathode ray tubes (CRT), plasma displays, and/or any suitable visual output device capable of visually conveying information to a user. For example, processor 138 may activate one or more components of display device 144 to indicate that circuit protection device 106 and/or trip mechanism 136 is active and/or operating normally, is receiving a blocking signal, is transmitting a blocking signal, that a fault or failure has occurred, and/or any other status of trip mechanism 136 and/or circuit protection device 106. In some embodiments, display device 144 presents a graphical user interface (GUI) to a user for interaction between the user and circuit protection device 106. The GUI permits the user, for example, to control circuit protection device 106, monitor operation/status of circuit protection device 106, test operation of circuit protection device 106, and/or modify operational parameters of circuit protection device 106.

Network interfaces 146 allows circuit protection devices 106 to communicate with each other, a central controller, and/or remote devices and systems as part of a wired or wireless communication network. Wireless network interfaces may include a radio frequency (RF) transceiver, a Bluetooth® adapter, a Wi-Fi transceiver, a ZigBee® transceiver, a near field communication (NFC) transceiver, an infrared (IR) transceiver, and/or any other device and communication protocol for wireless communication. (Bluetooth is a registered trademark of Bluetooth Special Interest Group of Kirkland, Wash.; ZigBee is a registered trademark of the ZigBee Alliance of San Ramon, Calif.) Wired network interfaces may use any suitable wired communication protocol for direct communication including, without limitation, USB, RS232, I2C, SPI, analog, and proprietary I/O protocols. Moreover, in some embodiments, the wired network interfaces include a wired network adapter allowing the computing device to be coupled to a network, such as the Internet, a local area network (LAN), a wide area network (WAN), a mesh network, and/or any other network to communicate with remote devices and systems via the network. Circuit protection devices 106 transmit and receive communications over the communication network using messages formatted according to an appropriate network communication protocol. In some embodiments, the network communication protocol is an Ethernet communication protocol or an Institute of Electrical and Electronics Engineers (IEEE) 802.11 based communication protocol.

Central controller 105 is configured to communicate with circuit protection devices 106 and monitor distribution system 100. Central controller 105 includes processor 138, memory 140 coupled to the processor 138, input device 142, display device 144, and network interface 146. In the example embodiment, central controller 105 directly controls operation of circuit protection devices 106 or instructs circuit protection devices 106 how to operate. In other embodiments, central controller 105 provides data (such as system-wide conditions, data determined by central controller 105, and the like) to circuit protection devices 106 to allow circuit protection devices 106 to operate according to their own settings. In some embodiments, the functions ascribed to central controller 105 are performed by one or more of circuit protection devices acting as a central controller. Moreover, central controller 105 may be located proximate circuit protection devices 106 or remote from circuit protection devices 106.

In addition to providing overcurrent and overvoltage protection to system 100, central controller 105 and circuit protection devices 106 provide ground fault detection and protection. Because of the possibility of circulating neutral currents on the neutral conductors 111 between sources 102 and busses 108 and 109, as well as on neutral conductors 111 of busses 108 and 109, known methods of determining whether or not a ground fault condition exists typically will struggle to identify ground fault currents associated with first tier 110 (including busses 108 and 109). System 100 avoids this difficulty by not relying on measurements of neutral current in neutral conductors 111 associated with source protection devices 114 and tie protection device 118 to detect ground fault currents associated with source protection devices 114 or tie protection device 118.

In system 100, each feeder protection device 116 measures its associated phase currents and neutral currents using sensors 134. By vector summing the phase currents, an amount of phase imbalance of each feeder protection device's load 104 may be determined. If the amount of imbalance substantially matches the measured neutral current associated with load 104, a ground fault condition does not exist. If the neutral current differs from the determined amount of imbalance by more than a threshold amount, a ground fault condition exists and system 100 can take appropriate action, such as tripping the appropriate one or more circuit protection devices 106. The threshold value, sometimes also referred to as a protection threshold, is a value that is based, for example on the accuracy of sensors 134, the amount of current flowing on bus 109, the number of feeder protection devices 134, and/or any other suitable characteristics of system 100. The threshold value is typically set low enough to be exceeded by all actual ground fault currents and high enough to reduce the likelihood of nuisance trips caused by measurement error or other non-fault factors. In the example embodiment the threshold value is a fixed value, while in other embodiments, the threshold value may be variable as a function of one or more operating conditions of system 100. In the example embodiment, all circuit protection devices 106 utilize the same threshold value, whether fixed or variable. In other embodiments, different circuit protection devices 106 use different threshold values. Moreover, in some embodiments, at least one circuit protection device 106 uses a fixed threshold value and at least one other circuit protection device uses a variable threshold value. In some embodiments, upon detecting a ground fault current or potential ground fault current, the feeder protection device 116 that detected a potential ground fault current outputs a blocking signal 117 to central controller 105 and/or all upstream circuit protection devices 106. Blocking signal 117 is a communication signal output from feeder protection device 116 to central controller 105 and/or all upstream circuit protection devices 106. Blocking signal 117 may be any suitable communication signal. In some embodiments, blocking signal 117 is produced as part of a binary system in which blocking signal 117 is a logic high signal (e.g., +5 volts) and the absence of blocking signal 117 is a logic low signal (e.g., 0 volts), or vice versa. In other embodiments, blocking signal 117 is a varying signal such as a sinewave, a square wave, a pulse, or the like. In still other embodiments, blocking signal 117 is a communications message according to any suitable communication protocol. Such a communications message may include an identification of the particular feeder protection device 116 transmitting the message, information about the particular fault detected, an intended response to the detected fault, and/or any other suitable information. Whatever the format used for blocking signal 117, blocking signal 117 is used to inform the recipients that feeder protection device 116 has identified the problem and is attempting to handle it. If the ground fault condition is not handled by feeder protection device 116 quickly enough, one or more upstream circuit protection devices 106 may be tripped despite the blocking signal 117.

Figure 2:
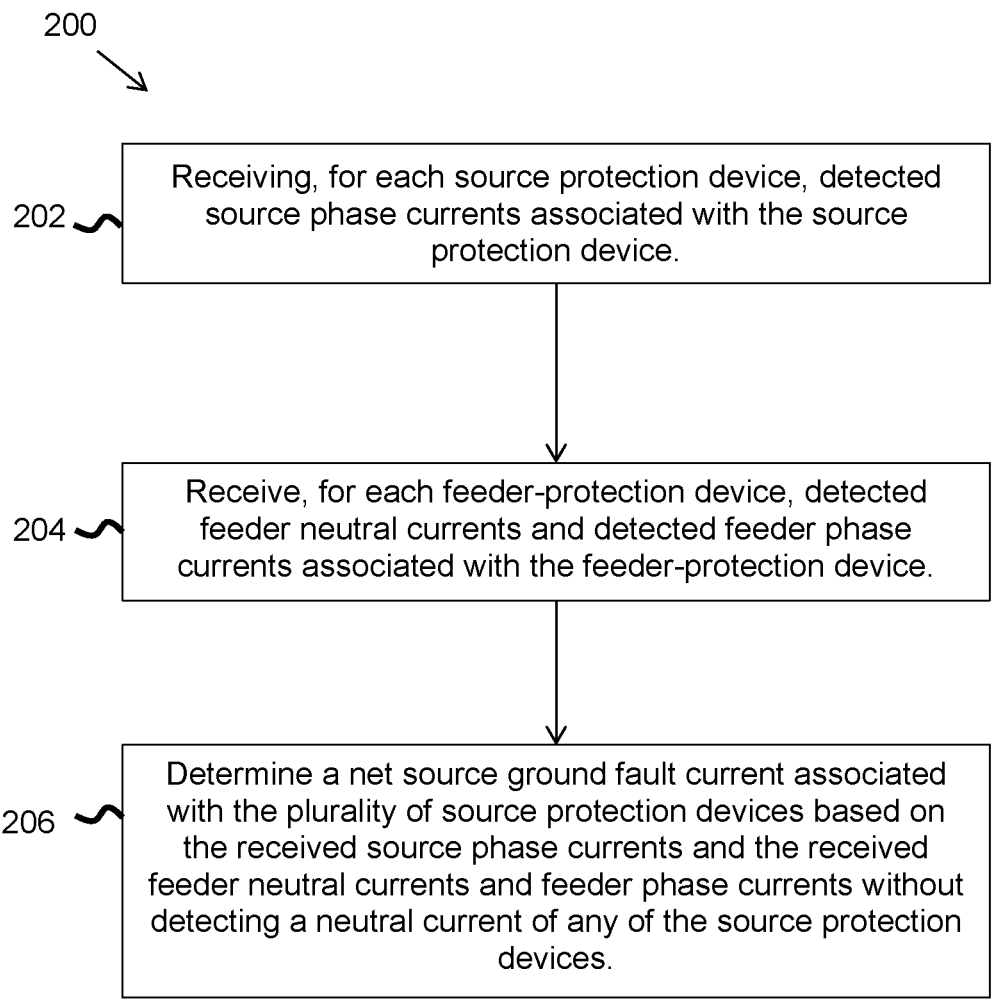
FIG. 2 is a flow diagram of an example method of operating a multi-phase power distribution system.

Detection and handling by system 100 of ground fault conditions associated with first tier 110 will be described with reference to FIG. 2. FIG. 2 is a flow diagram of a method 200 of operating a multi-phase power distribution system, such as system 100. In the example embodiment, method 200 is performed by central controller 105. In other embodiments, one of circuit protection devices 106 acts as a central controller and performs method 200. For simplicity of description, detection and handling of ground fault conditions in first tier 110 will be described with respect to a portion 150 of system 100 including bus 109. System 100 performs the same procedure for each additional bus in system 100. In some embodiments, system 100 performs the procedure for all busses at once, treating busses 108 and 109 as a single bus when tie protection device is closed. Method 200 assumes there are no significant neutral loads on bus 108 or 109 that do not flow through one of feeder protection devices 116. Small (relative to total current on the bus) neutral loads that do not flow through one of feeder protection devices 116 may be ignored.

At 202, central controller 105 receives detected source phase currents from each source protection device coupled to bus 109. Source phase currents associated with a source protection device are the values of electrical current in each phase conductor 107 that passes through source protection device 114 as detected using sensors 134. Tie protection device 118 is considered a source protection device for bus 109. If tie protection device 118 is open (i.e., tripped or removed), tie protection device 118 may be either not included in the determination at all or may be treated as all of its phase currents having a value of zero. Similarly, if source protection device 114 is tripped or removed, its values may be set to zero or it may be removed from consideration as a source protection device in method 200.

Central controller 105 receives, at 204, detected feeder neutral currents and detected feeder phase currents associated with each feeder protection device 116 coupled to bus 109. The detected currents are phasors or vectors presenting amplitude and phase of the detected currents. Feeder phase currents associated with a feeder protection device 116 are the values of electrical current in each phase conductor 107 that passes through feeder protection device 116 as detected using sensors 134. Similarly, feeder neutral currents are detected values of neutral current associated with a feeder protection device 116 as detected with one of its sensors 134.

The detected feeder neutral currents, detected feeder phase currents, and detected source phase currents are synchronized detections to correspond to substantially the same time. The synchronization may occur through any suitable synchronization method. For example, central controller 105 may output a synchronization signal to allow all circuit protection devices 106 to detect their phase currents and (as applicable) neutral currents at the same time. Another method of synchronization adds a time-stamp to the detected phase currents and neutral currents. The time-stamped current data may be used by central controller 105 to determine phase currents and neutral currents for a same, synchronized, time for all of circuit protection devices 106 without requiring that the currents be detected at a synchronized time.

At 206, central controller 105 determines, a net source ground fault current associated with the plurality of source protection devices 106 based on the received source phase currents and the received feeder neutral currents and feeder phase currents without detecting a neutral current of any of the source protection devices. The net source ground fault current represents the amount of ground fault current associated with bus 109 that is not going to a feeder protection device 116. The net source ground fault current may also be referred to as a net source ground fault.

Figure 3:
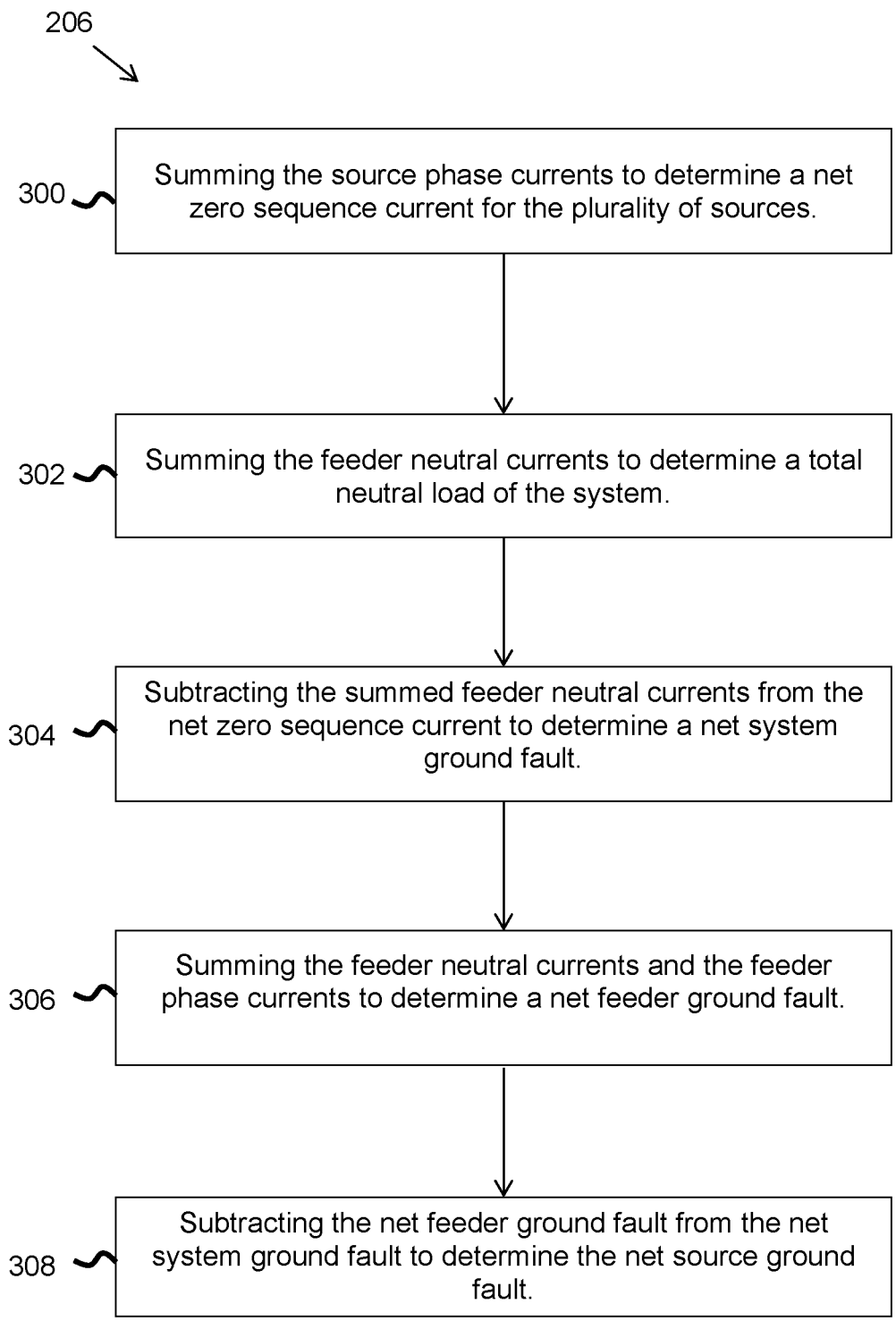
FIG. 3 is a flow diagram of a portion of the method shown in FIG. 2.

In some embodiments, net source ground fault current is determined through a series of calculations based on the received source phase currents and the received feeder neutral currents and feeder phase currents. FIG. 3 is a flow diagram of step 206 (shown in FIG. 2) according to some embodiments. A net system imbalance vector, also referred to as a net zero sequence current, is determined 300 by summing the received source phase currents. In the example embodiment, currents are added and subtracted (as appropriate) using vector summing. In other embodiments, currents are added and subtracted without reliance on vector summing. The net system imbalance vector represents the amount of load imbalance and ground fault current in portion 150 of system 100.

The received feeder neutral currents are vector summed at 302 to produce a net feeder neutral current vector that represents the total neutral load of the system. At 304, central controller 105 subtracts the net feeder neutral current vector from the net system imbalance vector to produce a net system ground fault vector. The net system ground fault vector indicates the amount of ground fault current in portion 150 of system 100, but does not differentiate between ground faults on bus 109 and ground faults associated with feeder protection devices 116. If the net system ground fault vector is zero or is very small (e.g., within the combined measurement tolerances of sensors 134), it is unlikely that a ground fault condition exists anywhere in portion 150 and central controller 105 determines that no ground fault condition exists. If the net system ground fault vector is not equal to or close to zero (e.g., less than a threshold value determined based on the combined measurement tolerances of sensors 134), there is likely a ground fault condition somewhere in portion 150. The threshold value is a predetermined value that is based, for example on the accuracy of sensors 134, the amount of current flowing on bus 109, the number of feeder protection devices 134, and/or any other suitable characteristics of system 100. The threshold value is typically set low enough to be exceeded by all actual ground fault currents and high enough to reduce the likelihood of nuisance trips caused by measurement error or other non-fault factors. In the example embodiment the threshold value is a fixed value, while in other embodiments, the threshold value may be variable as a function of one or more operating conditions of system 100.

At 306, a net feeder ground fault vector is determined by summing feeder neutral currents and feeder phase currents. In the example embodiment, feeder neutral currents and feeder phase currents are vector summed together. If the net feeder ground fault vector has a very low magnitude, there are likely no ground faults below feeder protection devices 116. If the net feeder ground fault vector has a magnitude that exceeds the threshold value for a ground fault condition at a feeder and none of the feeder protection devices 116 are responding to the ground fault (e.g., by tripping, preparing to trip, outputting an indication of a detected ground fault, initiating ground fault protection protocols, or the like), source protection device 114 will be operated according to its ground fault protection scheme and trip. This situation can occur when multiple, small ground fault currents affect multiple feeder protection devices 116 and the individual ground fault currents are too small to trip their associated feeder protection devices 116. The situation can also arise if a feeder protection device 116 fails to timely trip in response to a larger magnitude ground fault current.

In other embodiments the ground fault vector for each feeder protection device 116 is determined by vector summing each feeder protection device's detected feeder phase currents and feeder neutral currents. The magnitude of the resulting vector is the amount of ground fault current attributable to each feeder protection device 116. If the magnitude of the ground fault vector for a feeder protection device 116 exceeds that feeder protection device's protective threshold, that particular feeder protection device 116 is tripped. The ground fault current vectors calculated for the individual feeder protection devices 116 are vector summed to produce a net feeder ground fault vector.

At 308, central controller 105 compares (e.g., subtracts) the net feeder ground fault vector to the net system ground fault vector to determine a net source ground fault. If the amount of the net feeder ground fault vector is equal to the net system ground fault vector (or the difference between them is zero), central controller 105 knows that all of the ground fault current in portion 150 is attributable to the protection zone (i.e., the portion of the system downstream of and electrically connected to a particular protection device) of the feeder protection devices 116 and there is likely not a ground fault current on bus 109. If the net feeder ground fault vector is not equal to the net system ground fault vector, central controller 105 determines there is likely a ground fault current on bus 109 and its magnitude is determined by taking the difference between the ground fault current vector detected by feeder protection devices 116 and the net system ground fault vector to produce a net source ground fault vector.

If the net source ground fault vector exceeds a protection threshold, central controller operates all source protection devices coupled to bus 109. In this example, if tie protection device 118 is closed and conducting, there are two sources for the ground fault current on bus 109: source protection device 114 and tie protection device 118. In response to detecting the ground fault current exceeding the protection threshold, central controller 105 causes both source protection device 114 and tie protection device 118 to trip.

Figure 4:
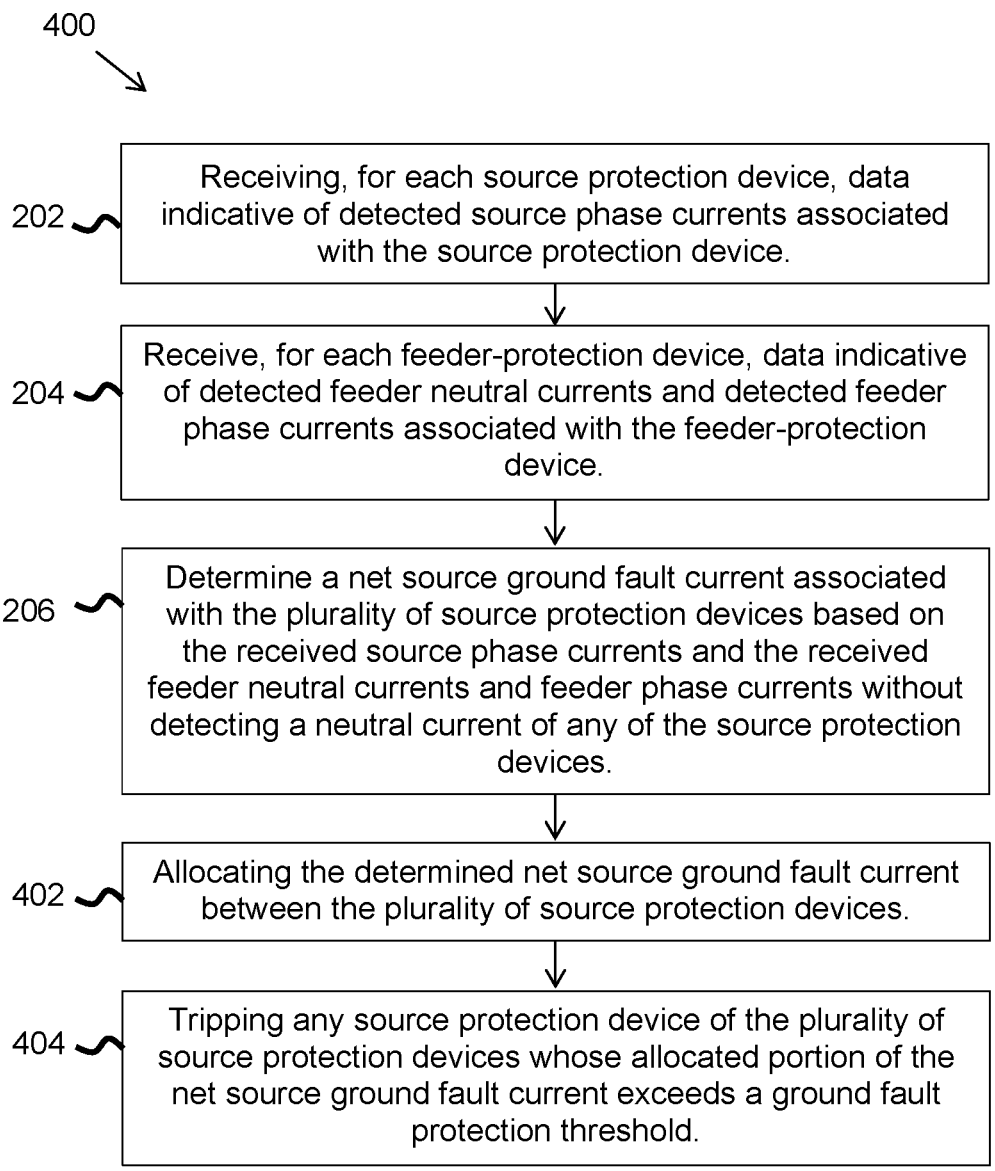
FIG. 4 is a flow diagram of another example method of operating a multi-phase power distribution system.
Figure 5:
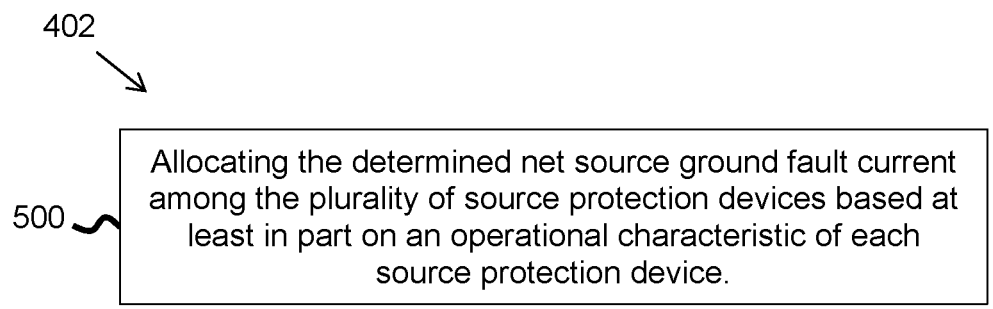
FIG. 5 is a flow diagram of a portion of the method shown in FIG. 4.
Figure 6:
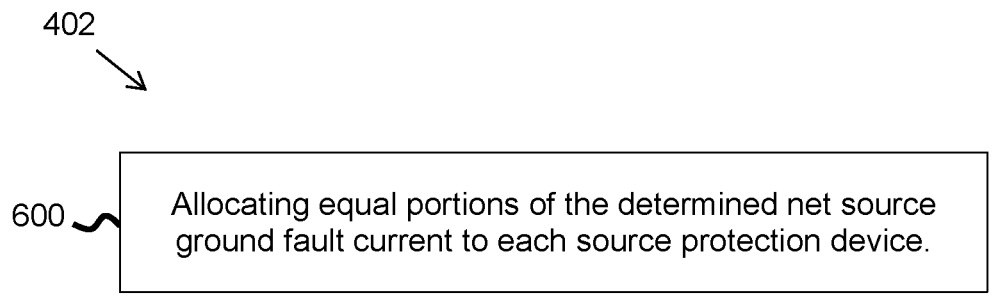
FIG. 6 is a flow diagram of a portion of the method shown in FIG. 4.

In other embodiments, central controller 105 allocates the bus ground fault current between all source protection devices coupled to bus 109. An example of such an embodiment is shown in FIG. 4 as method 400. Method 400 is the same as method 200 except as otherwise described herein. In method 400, the determined net source ground fault current is allocated 402 between the plurality of source protection devices. The allocation 402 may be performed according to any suitable allocation method. FIGS. 5 and 6 illustrate two different allocations that may be used in step 402. In FIG. 5, the determined net source ground fault current is allocated 500 among the plurality of source protection devices based at least in part on an operational characteristic of each source protection device. In the example embodiment, the operational characteristic is the proportion of the total current in portion 150 that is being provided by each device. The net source ground fault current is allocated to source protection device 114 and tie protection device 118 according to the determined proportion of total current that each provides. In other embodiments, allocation is based on any other suitable parameter or operational characteristic of source protection device 114 and tie protection device 118, such as impedance. In FIG. 6, the net source ground fault current is allocated 600 evenly among all sources coupled to bus 109. With reference again to FIG. 4, after allocating the determined net source ground fault current, any source protection device of the plurality of source protection devices whose allocated portion of the net source ground fault current exceeds a ground fault protection threshold is tripped at 404.

Figure 7:
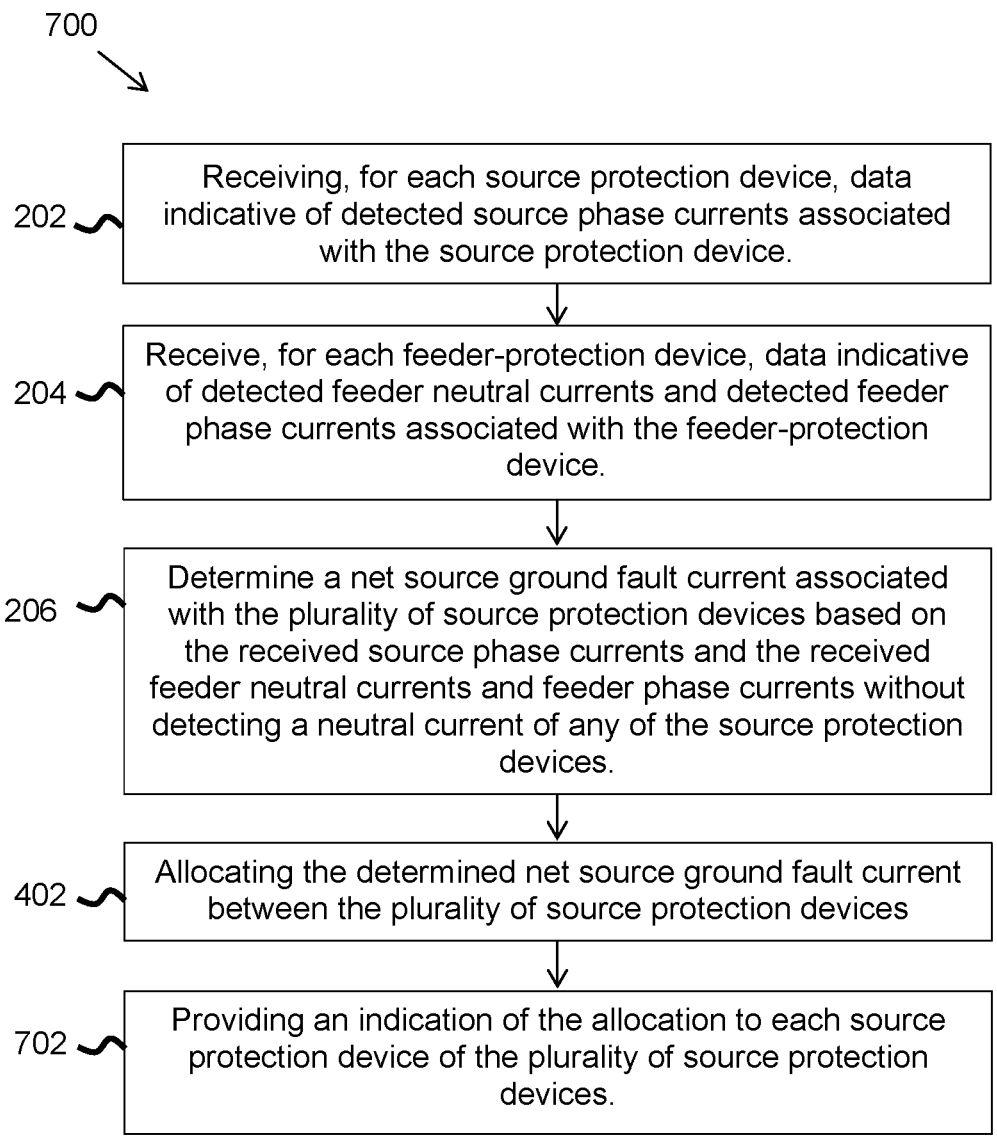
FIG. 7 is a flow diagram of another example method of operating a multi-phase power distribution system.

An example method 700 is shown in FIG. 7. Method 700 is the same as method 400 except as otherwise described herein. In method 700, after allocating the determined net source ground fault current, central controller 105 provides 702 an indication of the allocation to each source protection device of the plurality of source protection devices. Source protection device 114 and tie protection device 118 then operate according to their ground fault algorithms based on their allocated portions of ground fault current.

In other embodiments, one or more portions of method 200 are performed by individual circuit protection devices 106, while other portions are performed by central controller 105. For example, in some embodiments, each feeder protection device 116 may determine its own ground fault current based on its detected phase and neutral currents. Each feeder protection device 116 operates its own ground fault protection scheme based on the determined ground fault current. In some embodiments, the determined ground fault current is transmitted to central controller 105 for use as otherwise described herein, while in other embodiments, the original phase and neutral currents are transmitted to central controller 105.

Figure 8:
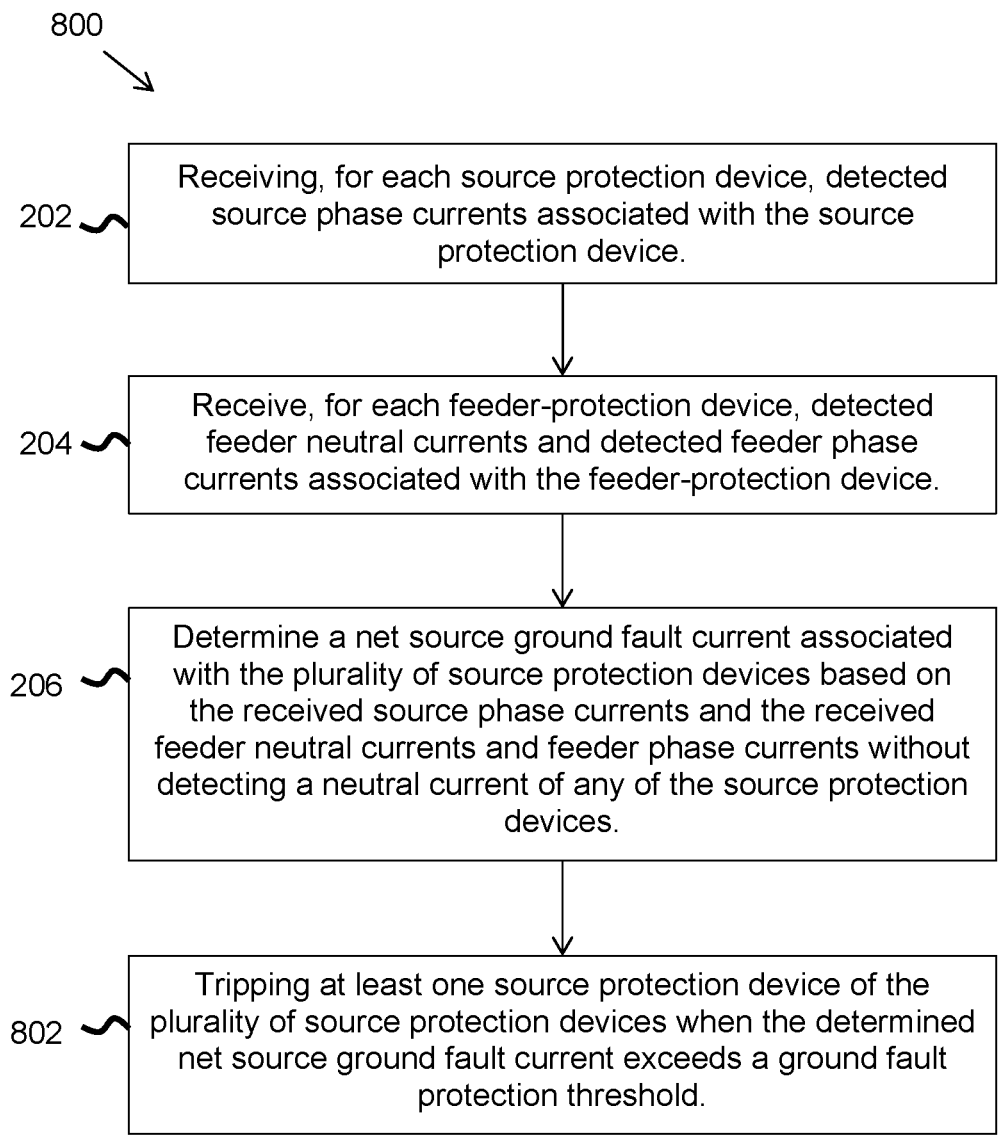
FIG. 8 is a flow diagram of another example method of operating a multi-phase power distribution system.

FIG. 8 is a flow diagram of another method 800 of operating a multi-phase power distribution system, such as system 100. Except as otherwise indicated, method 800 is the same as method 200 (shown in FIG. 2). Method 800 includes tripping 802 at least one source protection device of the plurality of source protection devices when the determined net source ground fault current exceeds a ground fault protection threshold. In an example embodiment, all source protection devices are tripped when the determined net source ground fault current exceeds a ground fault protection threshold. In other embodiment, less than all source protection devices are tripped.

An alternative method of operating a multi-phase power distribution system, such as system 100 will also be described with respect to a portion 150 of system 100 including bus 109. System 100 performs the same procedure for each additional bus in system 100. In some embodiments, system 100 performs the procedure for all busses at once, treating busses 108 and 109 as a single bus when tie protection device is closed. The alternative method is similar to method 200, but circuit protection devices 106 are more active in performance of the method. Except as otherwise described herein, the alternative method is the same as method 200. In the alternative method, certain steps are performed by central controller 105. In other embodiments, one of circuit protection devices 106 functions as central controller 105 and performs the steps described herein.

In the alternative method, central controller 105 receives detected source phase currents from each source protection device coupled to bus 109. Central controller 105, receives, at 304, detected feeder neutral currents associated with each feeder protection device 116 coupled to bus 109. The detected feeder neutral currents and detected source phase currents are synchronized detections to correspond to substantially the same time.

In the example embodiment, each feeder protection device 116 determines if there is a ground fault in its protection zone by vector summing its detected phase and neutral currents. A nonzero result greater than a threshold value indicates a ground fault current may be present. Upon detecting a ground fault current or potential ground fault current, the feeder protection device 116 that detected a potential ground fault current outputs blocking signal 117 to central controller 105 and/or all upstream circuit protection devices 106 to let the recipients know that it has identified the problem and is handling it appropriately.

Central controller 105 determines whether a system ground fault condition exists based on the received feeder neutral currents, the received source phase currents, and a determination of whether or not any of feeder protection devices 116 is outputting blocking signal 117. Central controller 105 does not rely on any detected source neutral currents in the determination.

A net system unbalance vector is determined by vector summing the received source phase currents. The net system imbalance vector represents the amount of load imbalance and ground fault current in portion 150 of system 100. The received feeder neutral currents are vector summed to produce a net feeder neutral current vector. Central controller 105 subtracts the net feeder neutral current vector from the net system imbalance vector to produce a net system ground fault vector. The net system ground fault vector indicates the amount of ground fault current in portion 150 of system 100, but does not differentiate between ground fault currents on bus 109 and ground fault currents associated with feeder protection devices 116. If the net system ground fault current is less than or equal to a threshold value, central controller determines that there is no ground fault current in the system and does not engage any protection logic of source protection devices 114. The threshold value is a predetermined value that is based, for example on the accuracy of sensors 134, the amount of current flowing on bus 109, the number of feeder protection devices 134, and/or any other suitable characteristics of system 100. The threshold value is typically set low enough to be exceeded by the magnitude of all actual ground fault currents and high enough to reduce the likelihood of nuisance trips caused by measurement error or other non-fault factors. In the example embodiment the threshold value is a fixed value, while in other embodiments, the threshold value may be variable as a function of one or more operating conditions of system 100.

If the net system ground fault vector is greater than the threshold value (indicating there is a ground fault current in system 100) and blocking signal 117 is being output by one of feeder protection device 116, a secondary protection logic is engaged for each source protection device 114. The blocking signal 117 indicates that a feeder protection device 116 has identified a fault and is attempting to handle the situation. The secondary protection logic is deliberately slower than the primary protection logic to allow the downstream feeder protection devices 116 time to handle the potential fault, if possible.

If the net system ground fault vector indicates there is a ground fault current in system 100 and there are no blocking signals 117 being output by any of feeder protection devices 116, a primary (faster) protection logic is engaged for each source protection device 114. The lack of any blocking signals 117 indicates that no feeder protection device 116 has identified the fault. This can indicate one or more faulty feeder protection devices 116 or a fault on bus 109. Either way, it is likely preferable for source protection devices 114 to handle the fault.

Technical effects of the example embodiments described herein include allowing ground fault current to be detected in situations that may trouble other known systems. The example embodiments detect source ground fault current in the presence of circulating neutral currents by determining the ground fault current based on measurements that do not include a neutral current measurement for source protection devices. This also allows the example embodiments to detect ground fault currents even if one or more source protection devices is disconnected or removed, not reporting neutral current measurements, or not taking neural current measurements. The example embodiments improve operation of multi-source systems, systems with connected neutral conductors, systems in which neutral connections are not interrupted by tripping or removing a protection device, and systems susceptible to circulating neutral currents.

Exemplary embodiments of power distribution systems and methods of operating power distribution systems and/or circuit protection devices are described above in detail. The systems and methods are not limited to the specific embodiments described herein but, rather, components of the systems and/or operations of the methods may be utilized independently and separately from other components and/or operations described herein. Further, the described components and/or operations may also be defined in, or used in combination with, other systems, methods, and/or devices, and are not limited to practice with only the power system as described herein.

The order of execution or performance of the operations in the embodiments of the invention illustrated and described herein is not essential, unless otherwise specified. That is, the operations may be performed in any order, unless otherwise specified, and embodiments of the invention may include additional or fewer operations than those disclosed herein. For example, it is contemplated that executing or performing a particular operation before, contemporaneously with, or after another operation is within the scope of aspects of the invention.

Although specific features of various embodiments of the invention may be shown in some drawings and not in others, this is for convenience only. In accordance with the principles of the invention, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A method of operating a solidly grounded, multi-source, multi-phase power distribution system having coupled neutral conductors, said power distribution system including a bus, a plurality of source protection devices coupled to the bus, and a plurality of feeder protection devices coupled to the bus, the method comprising:
receiving, for each source protection device of the plurality of source protection devices, data indicative of detected source phase currents associated with the source protection device;
receiving, for each feeder protection device of the plurality of feeder protection devices, data indicative of detected feeder neutral currents and detected feeder phase currents associated with the feeder protection device; and
determining a net source ground fault current associated with the plurality of source protection devices based on the received data indicative of source phase currents and the received data indicative of feeder neutral currents and feeder phase currents, without detecting a neutral current of any of the source protection devices.

2. The method of claim 1, further comprising tripping at least one source protection device of the plurality of source protection devices when the determined net source ground fault current exceeds a ground fault protection threshold.

3. The method of claim 2, wherein tripping at least one source protection device of the plurality of source protection devices when the determined net source ground fault current exceeds a ground fault protection threshold comprises tripping all source protection devices of the plurality of source protection devices when the determined net source ground fault current exceeds the ground fault protection threshold.

4. The method of claim 1, further comprising:
allocating the determined net source ground fault current between the plurality of source protection devices; and
tripping any source protection device of the plurality of source protection devices whose allocated portion of the net source ground fault current exceeds a ground fault protection threshold.

5. The method of claim 4, wherein allocating the determined net source ground fault current between the plurality of source protection devices comprises allocating equal portions of the determined net source ground fault current to each source protection device.

6. The method of claim 4, wherein allocating the determined net source ground fault current between the plurality of source protection devices comprises allocating the determined net source ground fault current among the plurality of source protection devices based at least in part on an operational characteristic of each source protection device.

7. The method of claim 1, further comprising:
allocating the determined net source ground fault current between the plurality of source protection devices; and
providing an indication of the allocation to each source protection device of the plurality of source protection devices to allow each source protection device to respond according to its allocated portion of the determined net source ground fault current and its own ground fault protection programming.

8. The method of claim 1, wherein determining a net source ground fault current associated with the plurality of source protection devices comprises:
summing the source phase currents to determine a net zero sequence current for the plurality of sources;
summing the feeder neutral currents to determine a total neutral load of the system;
subtracting the summed feeder neutral currents from the net zero sequence current to determine a net system ground fault;
summing the feeder neutral currents and the feeder phase currents to determine a net feeder ground fault; and
subtracting the net feeder ground fault from the net system ground fault to determine the net source ground fault.

9. The method of claim 8, wherein receiving data indicative of detected source phase currents comprises receiving source phase current vectors, and wherein receiving data indicative of detected feeder neutral currents and detected feeder phase currents comprises receiving feeder neutral current vectors and feeder phase current vectors.

10. A solidly grounded, multi-phase power distribution system having coupled neutral conductors, the multi-phase power distribution system comprising:
a bus;
a plurality of sources;
a source protection device, said source protection device coupled between at least one source of said plurality of sources and said bus, said source protection device including a plurality of sensors configured to detect a plurality of source phase currents associated with said at least one source protection device;
a plurality of feeder protection devices coupled to the bus, each feeder protection device including a plurality of sensors configured to detect a plurality of feeder phase currents and a feeder neutral current associated with said feeder protection device;
a controller including a processor and a memory, said memory storing non-transitory instructions that configure said processor to:
receive data indicative of the detected plurality of source phase currents from said source protection device;
receive, from each feeder protection device, data indicative of the detected plurality of feeder phase currents and the detected feeder neutral current; and
determine, a net source ground fault current associated with said source protection device based on the received data indicative of source phase currents, the received data indicative of feeder phase currents, and the received data indicative of feeder neutral currents, without receiving data indicative of a detected neutral current associated with said source protection device.

11. The multi-phase power distribution system of claim 10, wherein the non-transitory instructions configure said processor to trip said source protection device when the determined net source ground fault current exceeds a ground fault protection threshold.

12. The multi-phase power distribution system of claim 10, wherein the non-transitory instructions configure said processor to determine the net source ground fault current by:
summing the source phase currents to determine a net zero sequence current;
summing the feeder neutral currents to determine a total neutral load of said system;
subtracting the summed feeder neutral currents from the net zero sequence current to determine a net system ground fault;
summing the feeder neutral currents and the feeder phase currents to determine a net feeder ground fault; and subtracting the net feeder ground fault from the net system ground fault to determine the net source ground fault.

13. The multi-phase power distribution system of claim 10, wherein said controller is included in said source protection device.

14. The multi-phase power distribution system of claim 10, wherein said controller is included in one of said feeder protection devices.

15. The multi-phase power distribution system of claim 10, wherein said controller is a central controller separate from said at least one source protection device and said plurality of said feeder protection devices.

16. A solidly grounded, multi-phase power distribution system having coupled neutral conductors, the multi-phase power distribution system comprising:
- a bus;
- a plurality of sources;
- a source protection device, said source protection device coupled between at least one source of said plurality of sources and said bus, said source protection device including a plurality of sensors configured to detect a plurality of source phase currents associated with said source protection device;
- a plurality of feeder protection devices coupled to the bus, each feeder protection device including a processor, a memory, and a plurality of sensors configured to detect a plurality of feeder phase currents and a feeder neutral current associated with said feeder protection device, said memory storing non-transitory instructions that configure said processor to:
  - vector sum the plurality of feeder phase currents and feeder neutral currents detected by said plurality of sensors to determine a ground fault current through said feeder protection device; and
  - output a blocking signal if the determined ground fault current exceeds a threshold value; and
- a controller including a processor and a memory, said memory storing non-transitory instructions that configure said processor to:
  - receive the detected plurality of source phase currents from said source protection device;
  - receive the detected feeder neutral current from each feeder protection device;
  - determine whether any feeder protection device is outputting a blocking signal; and
  - determine whether to engage a ground fault protection logic of the source protection device based on the received source phase currents, the received feeder neutral currents, and the determination of whether any feeder protection device is outputting a blocking signal, without receiving a detected neutral current associated with said source protection device.

17. The power distribution system of claim 16, wherein the non-transitory instructions configure said processor to subtract a vector sum of the received feeder neutral currents from a vector sum of the received source phase currents to determine a system ground fault current.

18. The power distribution system of claim 17, wherein the non-transitory instructions configure said processor to engage a source ground fault protection logic of said source protection device based on the received source phase currents, the received feeder neutral currents, and the determination of whether any feeder protection device is outputting a blocking signal by:
- determining to engage a primary ground fault protection logic of said source protection device when the determined system ground fault current equals or exceeds a threshold value and no feeder protection device is outputting a blocking signal;
- determining to engage a secondary ground fault protection logic of said source protection device when the determined system ground fault current equals or exceeds the threshold value and any feeder protection device is outputting a blocking signal, wherein the secondary ground fault logic will take longer to cause said source protection device to trip than the primary ground fault protection logic; and
- determining not to engage any ground fault protection logic of said source protection device when the determined system ground fault current is less than the threshold value.

\* \* \* \* \*